(12) United States Patent
Salavati-Niasari et al.

(10) Patent No.: US 8,361,931 B2
(45) Date of Patent: Jan. 29, 2013

(54) METHOD FOR PREPARING YTTRIUM BARIUM COPPER OXIDE (YBCO) SUPERCONDUCTING NANOPARTICLES

(76) Inventors: Masoud Salavati-Niasari, Kashan (IR); Sima Alikhanzadeh-Arani, Tehran (IR)

( * ) Notice: Subject to any disclaimer, the term of this patent is extended or adjusted under 35 U.S.C. 154(b) by 0 days.

(21) Appl. No.: 13/343,508

(22) Filed: Jan. 4, 2012

(65) Prior Publication Data

US 2012/0115731 A1    May 10, 2012

(51) Int. Cl.
*C04B 35/00* (2006.01)
(52) U.S. Cl. ........ 505/445; 505/126; 505/300; 505/125; 505/500; 505/510; 505/734; 977/776; 423/263
(58) Field of Classification Search .......... 505/445, 505/125, 126, 300, 500, 510, 734; 977/776; 423/263

See application file for complete search history.

(56) References Cited

U.S. PATENT DOCUMENTS

| | | | | |
|---|---|---|---|---|
| 5,004,720 A | * | 4/1991 | Kobayashi et al. | 505/440 |
| 5,112,802 A | * | 5/1992 | Takano et al. | 505/232 |
| 5,294,599 A | * | 3/1994 | Shibata et al. | 505/440 |
| 5,304,533 A | * | 4/1994 | Kobayashi et al. | 505/440 |

\* cited by examiner

*Primary Examiner* — Steven Bos

(57) ABSTRACT

A method for preparing yttrium barium copper oxide ("YBCO"; "Y-123"; $YBa_2Cu_3O_{7-x}$) superconducting nanoparticles is disclosed. The YBCO superconducting nanoparticles are prepared via a solid-state reaction by a solid-state reaction of an yttrium precursor, a barium precursor, and a copper precursor. One or more of the precursors are metal chelate compounds having acetylacetone ligands, which are highly stable and have a high compatibility with the other precursors.

12 Claims, 5 Drawing Sheets

METHOD FOR PREPARING YTTRIUM BARIUM COPPER OXIDE (YBCO) SUPERCONDUCTING NANOPARTICLES

SPONSORSHIP STATEMENT

This application has been financially sponsored for international filing by the Iranian Nanotechnology Initiative Council, University of Kashan, and the Islamic Azad University, Science and Research Branch, which do not have any rights in this application.

TECHNICAL FIELD

This application generally relates to superconducting materials, and more particularly relates to a method for preparing yttrium barium copper oxide ("YBCO") superconducting nanoparticles.

BACKGROUND

Many efforts have been made to synthesize superconducting nanoparticles, such as yttrium barium copper oxide ("YBCO") superconducting nanoparticles, and to use the superconducting nanoparticles in nanowires, nanofibers, and nanocomposites. However, YBCO superconducting nanoparticles synthesized through conventional solid-state reactions exhibit poor homogeneity, high porosity, and a relatively large particle size due to the formation of impurities, such as barium carbonate ($BaCO_3$), during the reactions. As such, research has focused on wet chemical techniques, such as sol-gel methods, co-precipitation methods, spray-drying methods, and microemulsion methods to obtain YBCO superconducting nanoparticles having a better morphology. Though wet chemical techniques result in high quality nanoparticles, the cost and complexity of their synthesis is much higher relative to solid-state techniques. As such, a new, more economical method to prepare high quality YBCO superconducting nanoparticles using solid-state techniques is needed.

SUMMARY

Yttrium barium copper oxide ("YBCO") superconducting nanoparticles and a method for preparing YBCO superconducting nanoparticles are disclosed. Initially, tris(acetylacetonato)triaquayttrium(III), barium oxide, and bis(acetylacetonato)copper(II) are mixed to prepare yttrium barium copper oxide particles. The yttrium barium copper oxide particles are then ground. Finally, the ground yttrium barium copper oxide particles are calcined at a temperature between 900° C. and 1000° C. to prepare the yttrium barium copper oxide superconducting nanoparticles.

In some implementations, the tris(acetylacetonato)triaquayttrium(III) can be prepared by reacting an yttrium nitrate with acetylacetone. The yttrium nitrate can be yttrium (III) nitrate pentahydrate. In some implementations, the bis(acetylacetonato)copper(II) can be prepared by reacting a copper acetate with acetylacetone. The copper acetate can be copper(II) acetate trihydrate.

In some implementations, the molar ratio of the tris(acetylacetonato)triaquayttrium(III) to the barium oxide mixed to prepare the yttrium barium copper oxide particles can be 1:2. The molar ratio of the tris(acetylacetonato)triaquayttrium (III) to the bis(acetylacetonato)copper(II) mixed to prepare the yttrium barium copper oxide particles can be 1:3. In some implementations, the ground yttrium barium copper oxide particles can be calcined at 900° C. to prepare the yttrium barium copper oxide superconducting nanoparticles.

In some implementations, the calcined yttrium barium copper oxide particles can be annealed at a temperature between 400° C. and 900° C. to prepare the yttrium barium copper oxide superconducting nanoparticles. The calcined yttrium barium copper oxide particles can be annealed at 800° C. in the presence of oxygen to prepare the yttrium barium copper oxide superconducting nanoparticles.

Another method for preparing YBCO superconducting nanoparticles is also disclosed. Initially, an yttrium nitrate is reacted with acetylacetone to prepare tris(acetylacetonato) triaquayttrium(III) and a copper acetate is reacted with acetylacetone to prepare bis(acetylacetonato)copper(II). Next, the tris(acetylacetonato)triaquayttrium(III), barium oxide, and the bis(acetylacetonato)copper(II) are mixed to prepare yttrium barium copper oxide particles, where the molar ratio of the tris(acetylacetonato)triaquayttrium(III) to the barium oxide is 1:2, and the molar ratio of the tris(acetylacetonato) triaquayttrium(III) to the bis(acetylacetonato)copper(II) is 1:3. The yttrium barium copper oxide particles are then ground and the ground yttrium barium copper oxide particles are calcined at 900° C. Finally, the calcined yttrium barium copper oxide particles are annealed at 800° C. in the presence of oxygen to prepare the yttrium barium copper oxide superconducting nanoparticles.

Details of one or more implementations and/or embodiments of the method for preparing the YBCO superconducting nanoparticles are set forth in the accompanying drawings and the description below. Other aspects that can be implemented will be apparent from the description and drawings, and from the claims.

DETAILED DESCRIPTION

A method for preparing yttrium barium copper oxide ("YBCO"; "Y-123"; $YBa_2Cu_3O_{7-x}$) superconducting nanoparticles is disclosed. The YBCO superconducting nanoparticles are prepared via a solid-state reaction by a solid-state reaction of an yttrium precursor, a barium precursor, and a copper precursor. One or more of the precursors are metal chelate compounds having acetylacetone ligands, which are highly stable and have a high compatibility with the other precursors. The YBCO superconducting nanoparticles are pure superconducting nanoparticles achieved at a calcination temperature of between 850° C. and 950° C. and, preferably, 900° C., which is lower than the calcinations temperatures of known methods. Therefore, more conductive YBCO superconducting nanoparticles can be prepared at a lower cost according to the method of this application relative to known methods. Due to their increased conductivity and more homogenous structure, use of the YBCO superconducting nanoparticles in various products, such as, for example, wires, electrodes, and tapes, improves the products' critical current density.

Figure 1:
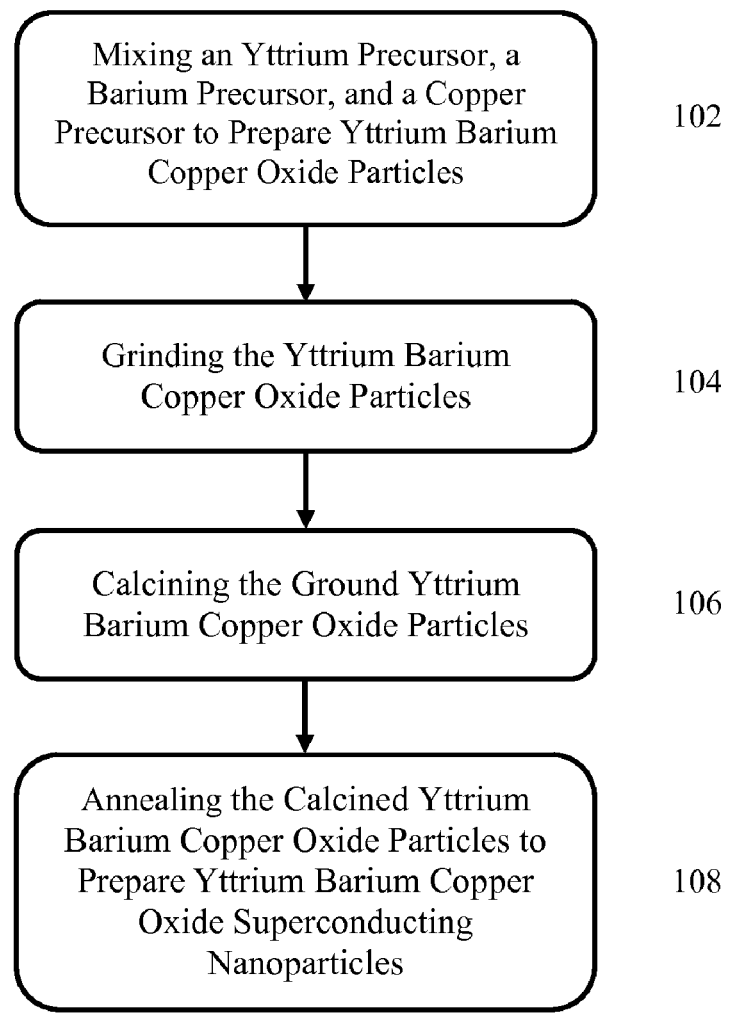
FIG. 1 illustrates an example of a method for preparing YBCO superconducting nanoparticles.

Referring to FIG. 1, an example method for preparing YBCO superconducting nanoparticles is illustrated. Initially, an yttrium precursor, a barium precursor, and a copper precursor are mixed to prepare YBCO particles (step 102). In some implementations, the yttrium precursor is tris(acetylacetonato)triaquayttrium(III) ($Y(acac)_3(H_2O)_3$), the barium precursor is barium oxide (BaO), and the copper precursor is bis(acetylacetonato)copper(II) ($Cu(acac)_2$). The yttrium precursor, barium precursor, and/or copper precursor can be received from another source and/or can be prepared. For example, to prepare tris(acetylacetonato)triaquayttrium(III), an yttrium nitrate can be reacted with acetylacetone ($C_5H_8O_2$), and to prepare the bis(acetylacetonato)copper(II), a copper acetate can be reacted with acetylacetone. By decomposing the metal chelate precursors, the YBCO superconducting nanoparticles will be substantially monodispersed, as explained in greater detail below.

The molar ratio of the yttrium:barium:copper ions should be 1:2:3 or 1:2:4. In some implementations, the yttrium precursor, barium precursor, and copper precursor are mixed at room temperature and a surfactant or protecting agent can also be added to the mixture in order to prevent agglomeration.

Next, the YBCO particles are ground (step 104). In some implementations, the YBCO particles can be ground using a mortar to decrease the size of the YBCO particles and, thereby, increase the surface area to mass ratio of the particles. The YBCO particles can be ground for a few hours at room temperature. By grinding the YBCO particles, the crystal particles in the powder are destroyed and reform as nanocrystalline fibers.

Next, the ground YBCO particles are calcined (step 106). In some implementations, the ground YBCO particles can be calcined at a temperature ranging from 900° C. to 1000° C. and, preferably, 900° C. for more than two hours and, preferably, 12 hours. The calcined YBCO particles are then slowly cooled to room temperature of about 25° C. and ground again into a fine powder for a few hours.

Next, the calcined YBCO particles are annealed to prepare the YBCO superconducting nanoparticles (step 108). In some implementations, the calcined YBCO particles can be annealed at a temperature ranging from 400° C. to 900° C. and, preferably, 800° C. in the presence of oxygen ($O_2$). Finally, the YBCO superconducting nanoparticles are slowly cooled to room temperature of about 25° C.

YBCO Superconducting Nanoparticles Preparation

Example

Initially, tris(acetylacetonato)triaquayttrium(III) and bis(acetylacetonato)copper(II) are initially prepared. To prepare the tris(acetylacetonato)triaquayttrium(III), about three grams, or 8.22 mmol, of yttrium(III) nitrate pentahydrate ($Y(NO_3)_3.5H_2O$) and about 2.55 mL of acetylacetone are individually dissolved in methanol ($CH_3OH$) and mixed together. Next, about 2.1 grams of sodium carbonate ($Na_2CO_3$) is added dropwise to the mixed solution of yttrium (III) nitrate pentahydrate and acetylacetone to form a white precipitate of tris(acetylacetonato)triaquayttrium(III). To isolate tris(acetylacetonato)triaquayttrium(III), the mixture is filtered to separate the precipitate and the precipitate is then washed one or more times with distilled water and dried in a heated environment at, for example, 50° C.

To prepare the bis(acetylacetonato)copper(II), a copper acetate is reacted with acetylacetone. In some implementations, for example, 0.02 mmol of acetylacetone is first dissolved in about 25 mL ethanol and added dropwise to about 25 mL, or 0.01 mmol, of copper(II) acetate trihydrate (cupric acetate trihydrate; $Cu(CH_3COO)_2.3H_2O$). The mixture of copper(II) acetate trihydrate and acetylacetone is then refluxed for about one hour at 50° C. to form a blue precipitate of bis(acetylacetonato)copper(II). To isolate the bis(acetylacetonato)copper(II), the mixture is filtered to separate the precipitate and the precipitate is then washed one or more times with distilled water and dried in a heated environment at 50° C.

Next, the prepared tris(acetylacetonato)triaquayttrium (III), the prepared bis(acetylacetonato)copper(II), and barium oxide are mixed at a molar ratio of 1:2:3 and at room temperature to form YBCO particles (step 102). Then, the YBCO particles are ground using a mortar for 1 hour (step 104). Then, the ground YBCO particles are calcined at a temperature of 900° C. for about 12 hours (step 106). The calcined YBCO particles are then slowly cooled to room temperature of about 25° C. and ground again into a fine powder for 1 hour. Next, the calcined YBCO particles are annealed at a temperature of 800° C. in the presence of oxygen to prepare the YBCO superconducting nanoparticles (step 108). Finally, the YBCO superconducting nanoparticles are slowly cooled to room temperature of about 25° C.

Figure 2:
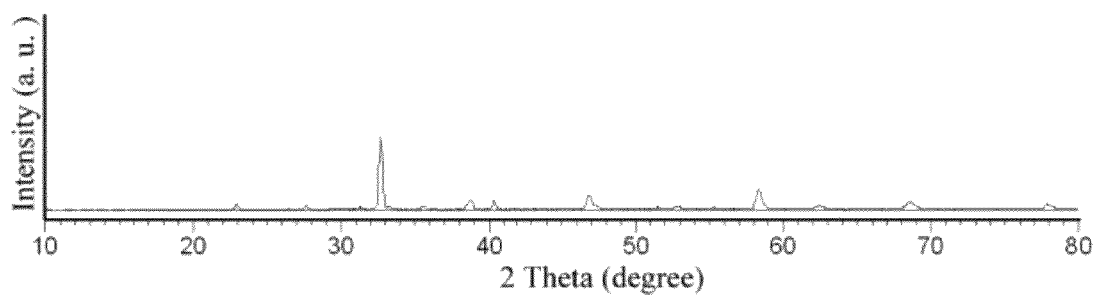
FIG. 2 illustrates an x-ray diffraction pattern of the YBCO superconducting nanoparticles.

Referring to FIG. 2, the phase identification of the YBCO superconducting nanoparticles prepared according to the EXAMPLE above is illustrated by an X-ray diffraction ("XRD") pattern recorded using an X-ray diffractometer using Ni-filtered Cu Kα radiation in the range of 10° to 80° (2θ). As shown in FIG. 2, the XRD pattern of the YBCO superconducting nanoparticles calcined at 900° C. is, unexpectedly, consistent with the theoretical spectrum of pure YBCO superconducting nanoparticles, and no peak attributable to possible impurities is observed.

However, YBCO superconducting nanoparticles prepared using the same procedure as that of the EXAMPLE above with the difference that the copper precursor is switched from bis(acetylacetonato)copper(II) to copper oxide (CuO), exhibit weak impurities attributable to barium-copper oxide ($BaCuO_2$) and copper oxide (CuO).

Similarly, YBCO superconducting nanoparticles prepared using the same procedure as that of the EXAMPLE above with the difference that the yttrium precursor is switched from tris(acetylacetonato)triaquayttrium(III) to yttrium(III) oxide ($Y_2O_3$), also exhibit impurities attributable to barium-copper oxide and copper oxide.

YBCO superconducting nanoparticles prepared using the same procedure as that of the EXAMPLE above with the difference that the copper precursor is switched from bis (acetylacetonato)copper(II) to copper oxide and the barium precursor is switched from barium oxide to barium acetylacetonate (barium bis(acetylacetonate); $Ba(acac)_2$), exhibit impurities attributable to barium-copper oxide. As such, only the use of tris(acetylacetonato)triaquayttrium(III) as the yttrium precursor, bis(acetylacetonato)copper(II) as the copper precursor, and barium oxide as the barium precursor according to the EXAMPLE above resulted in pure YBCO superconducting nanoparticles.

Figure 3:
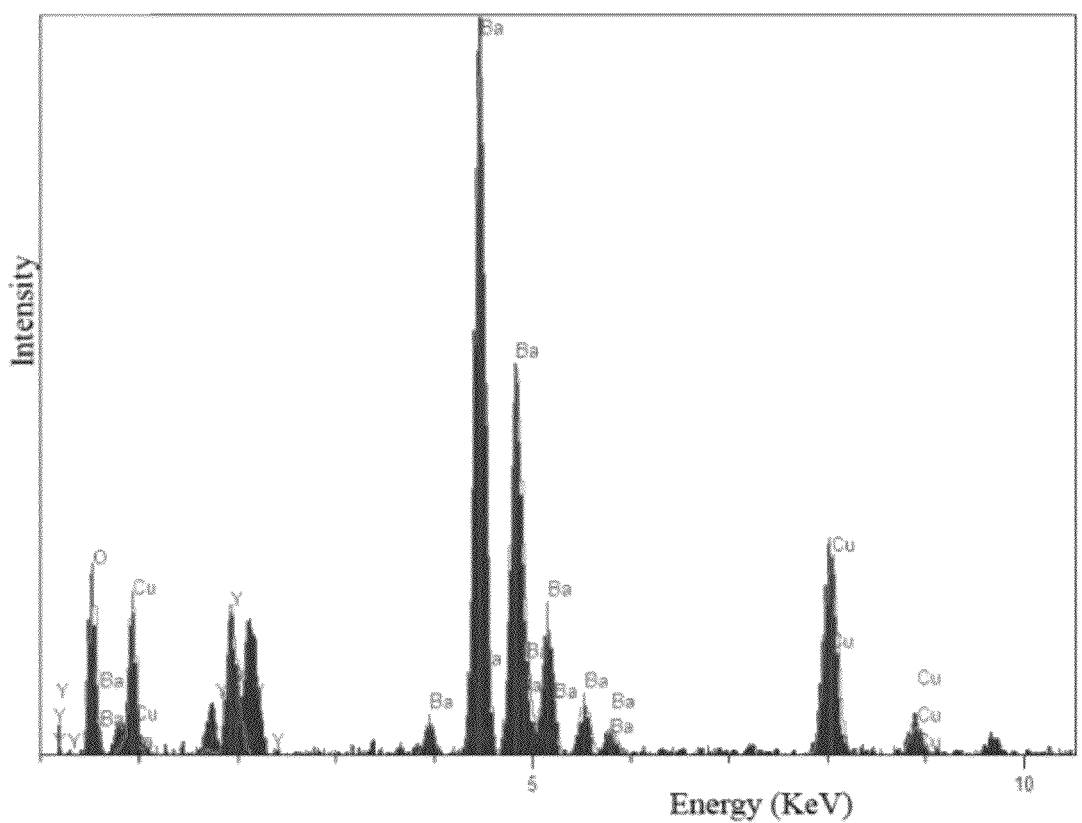
FIG. 3 illustrates an example energy dispersive X-ray spectroscopy spectrum of the YBCO superconducting nanoparticles.

The chemical purity and stoichiometry of the YBCO superconducting nanoparticles prepared according to the EXAMPLE above were tested by energy dispersive X-ray spectroscopy ("EDX") illustrated in FIG. 3. The EDX spectrum shown in FIG. 3 confirms the presence of yttrium, barium, copper, and oxygen in the YBCO superconducting nanoparticles without any impurities.

Figure 4:
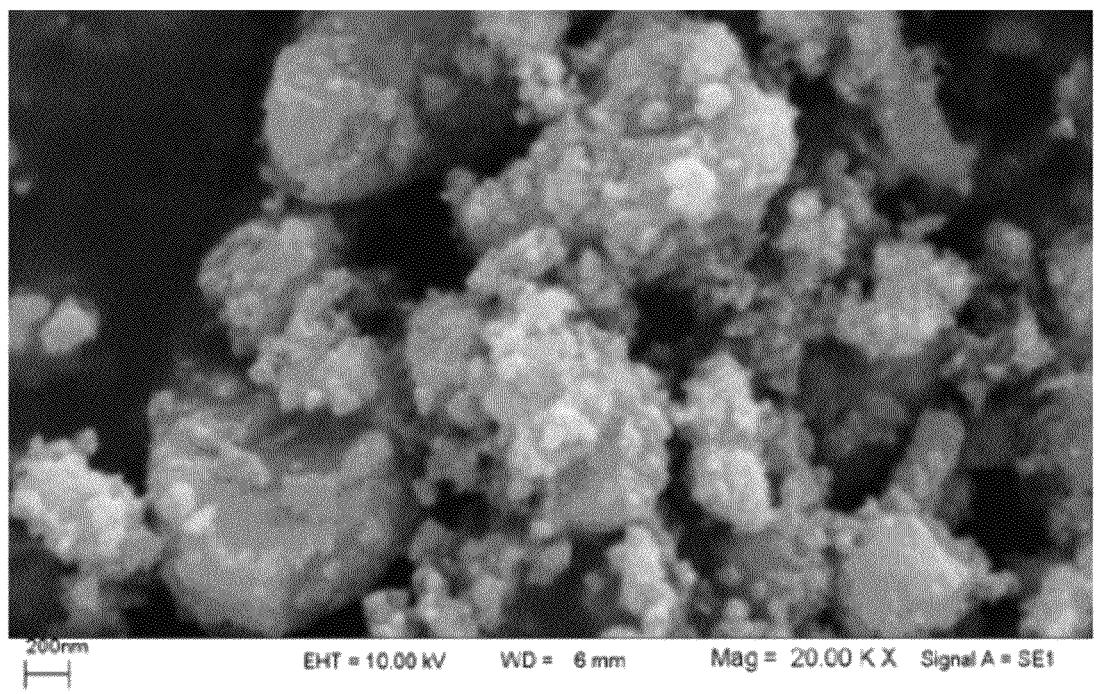
FIG. 4 illustrates a scanning electron micrograph of the YBCO superconducting nanoparticles.
Figure 5:
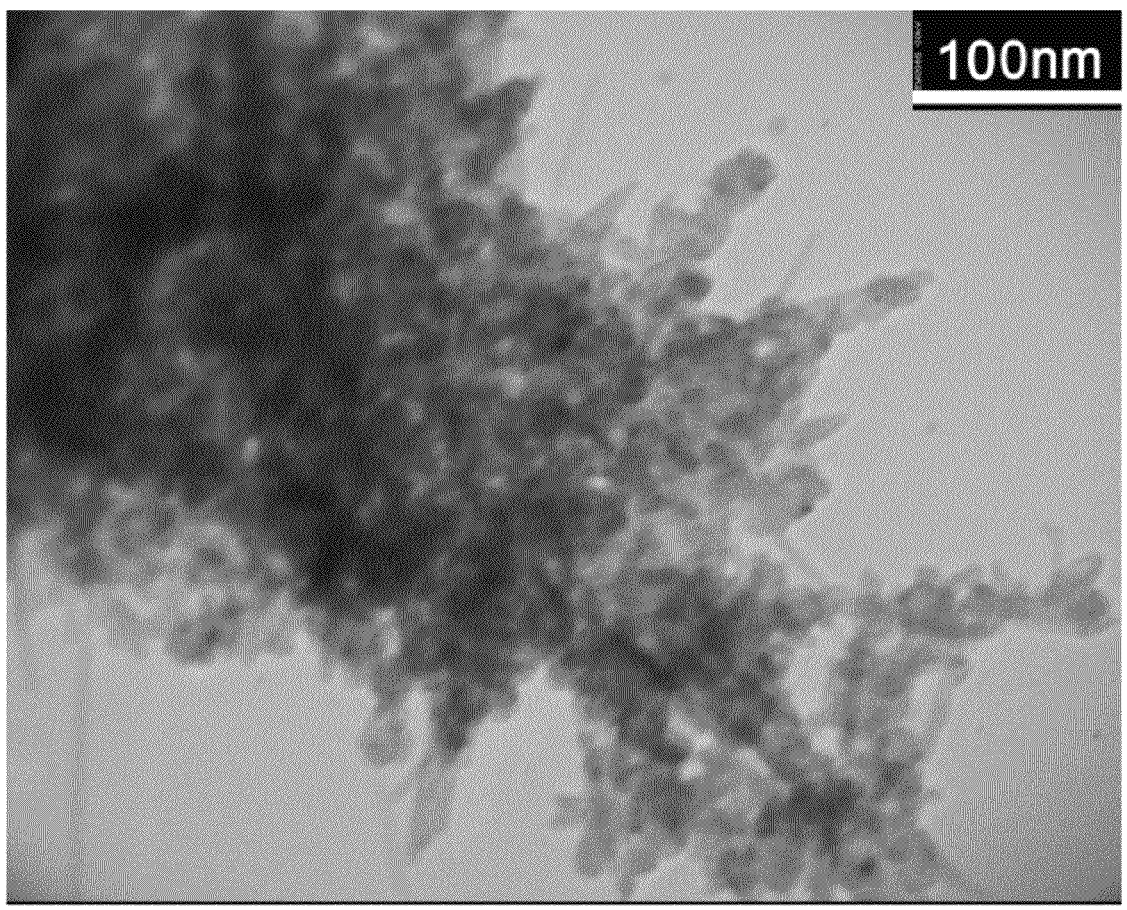
FIG. 5 illustrates a transmission electron micrograph of the YBCO superconducting nanoparticles Like reference symbols indicate like elements throughout the specification and drawings.

The morphologies of the YBCO superconducting nanoparticles prepared according to the EXAMPLE above are illustrated by the scanning electron microscope ("SEM") micrograph of FIG. 4 taken at a magnification of 20,000 times and the transmission electron microscope ("TEM") micrograph of FIG. 5 captured at an accelerating voltage of 100 kV. As illustrated in FIGS. 4 and 5, the YBCO superconducting nanoparticles have a quasi-spherical shape, exhibit low aggregation, and have an agglomerated size between 15 nm to 30 nm. The individual YBCO superconducting nanoparticles were calculated to have an average crystallite size of 11.7 nm using the Debye-Scherrer method.

However, YBCO superconducting nanoparticles prepared using the same procedure as that of the EXAMPLE above with the difference that the copper precursor is switched from bis(acetylacetonato)copper(II) to copper oxide, exhibit irregular shapes and larger particles due to agglomeration of the nanoparticles.

Similarly, YBCO superconducting nanoparticles prepared using the same procedure as that of the EXAMPLE above with the difference that the yttrium precursor is switched from tris(acetylacetonato)triaquayttrium(III) to yttrium(III) oxide, exhibit larger particle sizes due to agglomeration.

YBCO superconducting nanoparticles prepared using the same procedure as that of the EXAMPLE above with the difference that the calcination temperature is raised from 900° C. to 950° C., exhibit high agglomeration due to the increased temperature resulting in an average particle size of about 80 nm. As such, use of tris(acetylacetonato)triaquayttrium(III) as the yttrium precursor, bis(acetylacetonato)copper(II) as the copper precursor, barium oxide as the barium precursor, and the calcination temperature of 900° C. according to the EXAMPLE above results in homogenous YBCO superconducting nanoparticles having the smallest size due to the least agglomeration without any surfactant.

It is to be understood that the disclosed implementations are not limited to the particular processes, devices, and/or apparatus described which may, of course, vary. It is also to be understood that the terminology used herein is for the purpose of describing particular embodiments only, and is not intended to be limiting. As used in this application, the singular forms "a," "an," and "the" include plural referents unless the content clearly indicates otherwise.

Reference in the specification to "one implementation" or "an implementation" means that a particular feature, structure, characteristic, or function described in connection with the implementation is included in at least one implementation herein. The appearances of the phrase "in some implementations" in the specification do not necessarily all refer to the same implementation.

Accordingly, other embodiments and/or implementations are within the scope of this application.

What is claimed is:

1. A method for preparing yttrium barium copper oxide superconducting nanoparticles, comprising:
   mixing tris(acetylacetonato)triaquayttrium(III), barium oxide, and bis(acetylacetonato)copper(II) to prepare yttrium barium copper oxide particles;
   grinding the yttrium barium copper oxide particles; and
   calcining the ground yttrium barium copper oxide particles at a temperature between 850° C. and 1000° C. to prepare the yttrium barium copper oxide superconducting nanoparticles.

2. The method of claim 1, wherein the tris(acetylacetonato)triaquayttrium(III) is prepared by reacting an yttrium nitrate with acetylacetone.

3. The method of claim 2, wherein the yttrium nitrate is yttrium(III) nitrate pentahydrate.

4. The method of claim 1, wherein the bis(acetylacetonato)copper(II) is prepared by reacting copper acetate with acetylacetone.

5. The method of claim 4, wherein the copper acetate is copper(II) acetate trihydrate.

6. The method of claim 1, wherein the molar ratio of the tris(acetylacetonato)triaquayttrium(III) to the barium oxide mixed to prepare the yttrium barium copper oxide particles is 1:2.

7. The method of claim 1, wherein the molar ratio of the tris(acetylacetonato)triaquayttrium(III) to the bis(acetylacetonato)copper(II) mixed to prepare the yttrium barium copper oxide particles is 1:3.

8. The method of claim 1, wherein calcining the ground yttrium barium copper oxide particles at the temperature between 850° C. and 1000° C. comprises calcining the ground yttrium barium copper oxide particles at 900° C. to prepare the yttrium barium copper oxide superconducting nanoparticles.

9. The method of claim 1, further comprising grinding the calcined yttrium barium copper oxide particles.

10. The method of claim 1, further comprising annealing the calcined yttrium barium copper oxide particles at a temperature between 400° C. and 900° C. to prepare the yttrium barium copper oxide superconducting nanoparticles.

11. The method of claim 10, wherein annealing the calcined yttrium barium copper oxide particles at the temperature between 400° C. and 900° C. comprises annealing the calcined yttrium barium copper oxide particles at 800° C. in the presence of oxygen to prepare the yttrium barium copper oxide superconducting nanoparticles.

12. A method for preparing yttrium barium copper oxide superconducting nanoparticles, comprising:
   reacting an yttrium nitrate with acetylacetone to prepare tris(acetylacetonato)triaquayttrium(III);
   reacting a copper acetate with acetylacetone to prepare bis(acetylacetonato)copper(II);
   mixing the tris(acetylacetonato)triaquayttrium(III), barium oxide, and the bis(acetylacetonato)copper(II) to prepare yttrium barium copper oxide particles, wherein the molar ratio of the tris(acetylacetonato)triaquayttrium(III) to the barium oxide is 1:2, and the molar ratio of the tris(acetylacetonato)triaquayttrium(III) to the bis(acetylacetonato)copper(II) is 1:3;
   grinding the yttrium barium copper oxide particles;
   calcining the ground yttrium barium copper oxide particles at 900° C.; and
   annealing the calcined yttrium barium copper oxide particles at 800° C. in the presence of oxygen to prepare the yttrium barium copper oxide superconducting nanoparticles.

* * * * *